United States Patent [19]

Jones, Jr. et al.

[11] 4,214,120
[45] Jul. 22, 1980

[54] ELECTRONIC DEVICE PACKAGE HAVING SOLDER LEADS AND METHODS OF ASSEMBLING THE PACKAGE

[75] Inventors: William T. Jones, Jr.; Edward J. Moulis, both of Raytown, Mo.

[73] Assignee: Western Electric Company, Inc., New York, N.Y.

[21] Appl. No.: 955,289

[22] Filed: Oct. 27, 1978

[51] Int. Cl.² ............................................. H05K 1/06
[52] U.S. Cl. ................................ 174/52 FP; 29/591; 339/17 CF; 357/70
[58] Field of Search ............... 174/52 FP; 357/68, 69, 357/70; 339/17 C, 17 CF, 17 LC, 275 B; 29/589, 591, 630 R, 628; 338/313, 322, 329, 332; 24/259 R

[56] References Cited

U.S. PATENT DOCUMENTS

| | | |
|---|---|---|
| 1,232,584 | 7/1917 | McMunn ........................ 24/259 R X |
| 2,655,705 | 10/1953 | Hatfield .............................. 24/259 R |
| 3,650,232 | 3/1972 | Heinlen . |
| 3,689,684 | 9/1972 | Cox et al. ..................... 174/52 FP X |
| 3,691,629 | 9/1972 | Schierz . |
| 3,735,017 | 5/1973 | Manning . |
| 3,736,367 | 5/1973 | Heinlein et al. . |
| 3,824,679 | 7/1974 | Mosch et al. ....................... 29/589 X |
| 3,839,782 | 10/1974 | Lincoln . |
| 3,868,725 | 2/1975 | DeGraff ...................... 174/52 FP X |
| 4,032,706 | 6/1977 | Paletto . |
| 4,054,238 | 10/1977 | Lloyd et al. . |
| 4,059,810 | 11/1977 | Paletto . |

OTHER PUBLICATIONS

*Solok Terminations*, Berg Electronics Bulletin 124, Jun. 1976.
Photograph of commercially available lead frame submitted by applicants.

*Primary Examiner*—B. A. Reynolds
*Assistant Examiner*—D. A. Tone
*Attorney, Agent, or Firm*—W. O. Schellin

[57] ABSTRACT

An electronic circuit package (11) includes a substrate (14) with leads (21) extending from at least one edge thereof. The leads (21) have a split end (26) formed by two slits (31, 51). The slits divide the end into a lead stub (29) and a flag end (28). The flag end (28) is formed up in a step of approximately the thickness of the substrate (14). The forming of the flag end (28) foreshortens a flag support (32) to locate a flag (34) in substantial superposition to the lead stub (29). Both the lead stub (29) and the flag (34) are solder bonded to respective bond pads (18) on the upper and lower major surfaces of the substrate (14).

8 Claims, 7 Drawing Figures

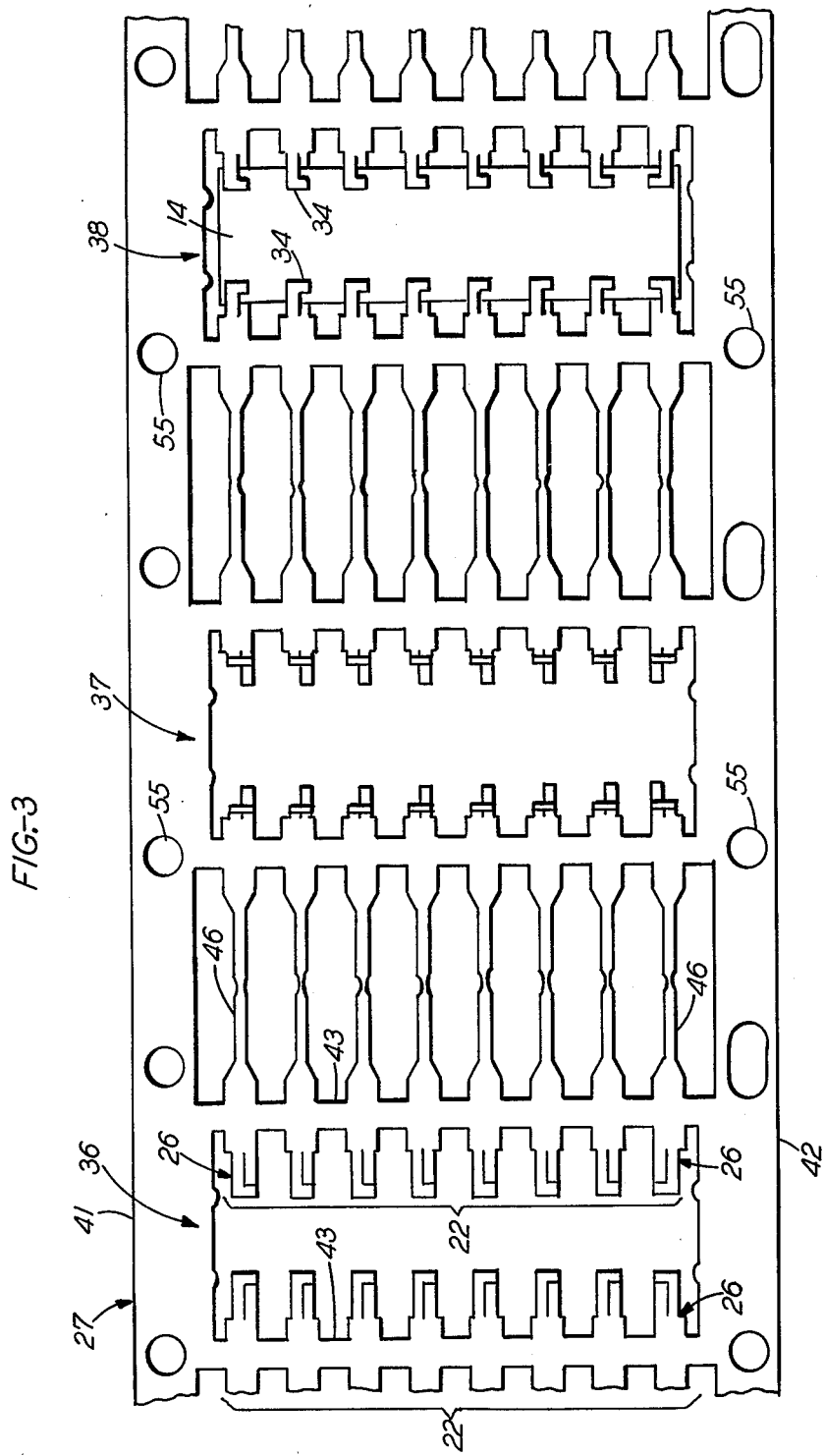

ELECTRONIC DEVICE PACKAGE HAVING SOLDER LEADS AND METHODS OF ASSEMBLING THE PACKAGE

TECHNICAL FIELD

This invention relates to a leaded electronic device package and to methods used in assembling such a package. The invention is, for example, applicable to leads attached to a substrate in a single or in dual rows, particularly to a thick-film dual in-line package (DIP) and to its assembly.

BACKGROUND OF THE INVENTION

Electronic device packages with multi lead outputs, such as those which house integrated semiconductor devices typically have a body portion in the shape of a right parallelepiped from which two parallel rows of leads protrude. These packages are known as dual in-line packages or DIPs. The size of these DIPs has been somewhat standardized. Particularly the spacing of the leads is commonly one tenth of an inch.

DIPs can also be used for electronic components other than semiconductor devices. For instance, a group of resistors could be encapsulated in a package having the shape of a DIP. To package components other than semiconductor devices in DIPs has the advantage of permitting the assembly of these other components into printed wiring boards with the same apparatus as that which assembles the semiconductor devices into such boards.

However, the DIPs housing such other components must, nevertheless, be price-compatible with similar more conventional packages housing such other components. Thick film resistors have in the recent past found increased acceptance and usage in the electronics industry. It is desirable to combine a group of thick film components into a DIP. Price compatible manufacturing techniques suggest the use of leads which are solder bonded to the ceramic substrates. Ceramic substrates are commonly used to support thick film circuits.

A problem with prior art solder leads has been that they typically take up more than one half of the available space with their widths, leaving less than one half of the space for gaps which might be used for additional circuit leads. When the spacing between adjacent leads becomes too narrow solder tends to bridge between adjacent conductors during the solder operation, thereby shorting the circuit. If the size of presently known leads is reduced to provide more space between adjacent leads, the smaller size of the surfaces to be soldered to the substrate tends to affect the strength of the bonds between the leads and the substrate.

It is, therefore, desirable to increase the gap between adjacent leads. This appears to be a solution to minimize solder bridging between such adjacent leads. Also to achieve a strong solder connection, a mechanically clamping edge connection between the lead and the substrate prior to soldering is desirable. It is further desirable to maximize the soldered area and still maintain a narrow lead termination.

SUMMARY OF THE INVENTION

This invention contemplates a lead structure capable of being clamped to an edge and across the thickness of a circuit substrate. Clamping lead portions are located substantially within the lateral confines of the lead on opposite faces of the substrate and at least in part in vertical superposition with one another. A single thickness of the lead material at the solder connection reduces an accumulation of solder, upon the lead becoming solder bonded to the substrate.

The lead structure has a metal body and at least one end with first and second lateral edges terminating in a top edge extending between the lateral edges. The end has a first slit extending from the first lateral edge of the body toward the center of the body. A second slit is located substantially at a right angle to the first slit. The second slit starts at the intersection of the first slit substantially at the center of the body and extends from there along the center away from the end of the body. The slits from a lead stub and a flag held to the body by a support.

BRIEF DESCRIPTION OF THE DRAWING

A description of a preferred embodiment of this invention may be read with reference to the appended drawing wherein:

FIG. 3 is a plan view of a portion of a lead frame strip in which frames are shown as they may appear in different stages of the assembly of the DIP of FIG. 1;

DETAILED DESCRIPTION

Figure 1:
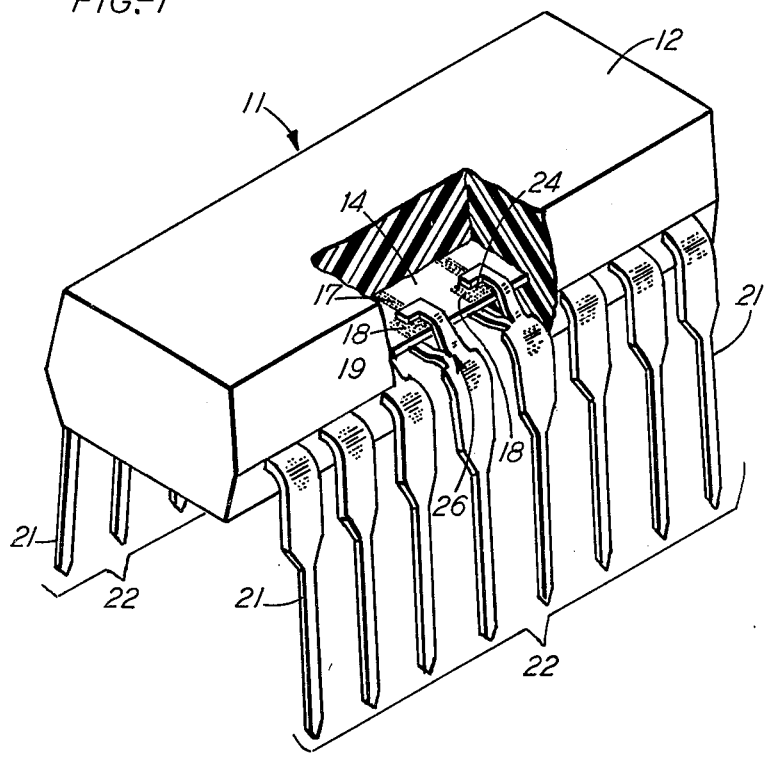
FIG. 1 is a pictorial representation of a film circuit DIP assembled in accordance with this invention.

Referring to FIG. 1, there is shown a "Dual In-line Package" (DIP) which is designated generally by the numeral 11. A body portion 12 of a molded plastic material, shown partially cut away houses a substrate 14. The substrate 14 is of alumina ceramic material. Alumina or a similar type ceramic is commonly used as a substrate material in the manufacture of film circuits.

Film circuit patterns are formed on at least one, but preferably on both, major surfaces in accordance with known techniques. The patterns and other elements are combined into film circuits 17 which may be simple or quite complex.

These circuits 17 terminate in contact pads or bond pads 18 adjacent to both longitudinal edges of 19 of the substrate 14. The bond pads 18 are preferably spaced along the edges 19 at a nominal distance of one tenth of an inch. However, other spacings are possible within the scope of this invention, if so desired. Preferably, the bond pads 18 are located on the substrate 14 in vertically coinciding pairs, one on each major surface of the substrate 14.

A lead 21 is solder-bonded to each of the pairs of bond pads 18. These leads 21 extend in two rows 22 from the two opposite longitudinal edges 19 of the substrate 14. External to the body portion 12 each lead 21 is bent through a right angle, so that all leads in the two rows 22 extend in the same direction. This right-angle bend is not necessary to practice the present invention. However, this external orientation of the leads 21 is characteristic for DIPs. It is desired that the DIPs 11 having leads 21 formed in this manner can be assembled into circuit boards (not shown) employing commonly used methods and commercially available equipment. The external configuration of the package and the orientation of the leads 21 are, therefore, not critical to the invention. However, it is advantageous that the leads correspond to currently standard dimensions and spacings to permit standard methods of assembly.

Figure 2:
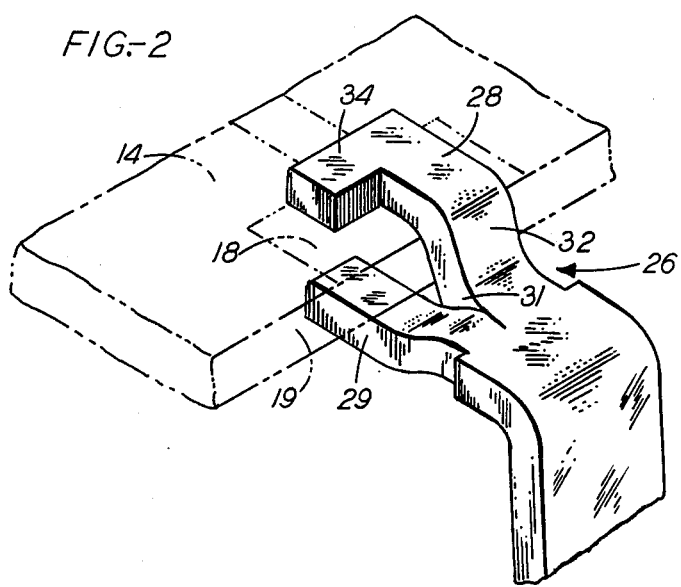
FIG. 2 is an enlarged pictorial representation of of a single lead of the DIP in FIG. 1.

Solder-bonded connections 24 of an inner end 26 of each lead 21 are shown in greater detail in FIG. 2. The term "inner end" of each lead 21 refers to the end 26 which is soldered to the bond pads 18 on the substrate 14. The end 26 is located within the plastic molded body portion 12 of the DIP 11, hence the term inner end. However, in reference to FIG. 3, the inner end 26 is also the inner, free end of each lead in a strip 27.

Referring back to FIG. 2, the inner end 26 is split into an upper flag end 28 and a lower lead stub 29. A slit or cut 31 longitudinally slits the end 26 and divides it into a flag support 32 and the lead stub 29. The widths of both the stub 29 and the flag support 32 together are no greater than the overall width of the lead 21. A flag 34 of the flag end 28 is integrally formed at the end of the support 32. The flag 34 faces toward the adjacent and underlying lead stub 29. Since the end 28 forms a step to raise the flag 34 by approximately the thickness of the substrate 14 with respect to the lead stub 29, the vertical projection of the flag 34 becomes foreshortened. Consequently, the surface area of the flag 34 becomes located in substantial superposition to the end of the lead stub 29. The substrate 14 is interposed between the lead stub 29 and the flag 34.

The stub 29 and the flag 34 grasp the substrate 14 at the respective pair of pads 18 in a mechanical hold even in the absence of a solder bond. The grasping surfaces of the flag 34 and the stub 29 on the pads 18 of the substrate 14 provide the basis for a subsequently applied strong solder joint between the lead 21 and the substrate 14.

Referring now to FIG. 3, the strip 27 shows a sequence of lead frames 36, 37 and 38 at different stages of the assembly of the DIP. The lead frame designated generally by the numeral 36 is shown after having been punched from a solid strip of metal. A progressive punch and die operation is typical for forming the lead frames 36. After the lead frames 36 have been formed, the strip 27 containing a plurality of identical lead frames 36 in sequence may be re-reeled and stored.

After the strip 27 has been formed, two outer rails 41 and 42 remain fixed with respect to each other by cross supports 43. Two of the cross supports 43 position the two opposed rows 22 of the leads 21 in each of the frames 36. The inner end 26 of each of the leads extends in a free, cantilevered manner from a respective one of the cross supports 43 toward one of the opposed leads 21. Each of the inner ends 26 terminates in an opposed, spaced relationship to the inner end 26 of the opposite lead 21. The distance by which the two opposite inner ends 26 are spaced is determined by the width of the substrate 14 which is to be attached to the ends of the leads 21.

An outer portion 46 of each lead 21 extends away from the cross supports 43 as an extension of and in a direction opposite to the inner end. The outer lead portions 46 of the leads do not terminate in free ends like the inner ends. The tip of each outer lead portion 46 in the strip 27 is bridged to the tip of an outer lead portion of the adjacent lead frame 36 in the strip.

Figure 5:
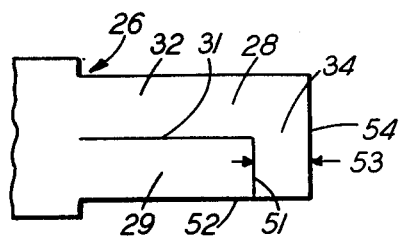
FIG. 5 is a plan view of a portion of a single lead of the frame in FIG. 3.

For a more detailed description of the inner end 26 of the lead, reference is made to FIGS. 3 and 5. The inner end 26 has the longitudinal slit 31, which terminates in its intersection with a lateral slit 51. The slit 51 extends inward from a first lateral edge 52 of the inner end 26 to form the shape of an "L" with the longitudinal slit 31. The slits 31 and 51 are formed by lancing the material of the lead. By lancing or slitting the material, it is separated, but then returned and left substantially in its original position. The lead material is preferably copper or a copper alloy of a type which is normally used for forming lead frames. Other materials which have similar conductive properties and also permit such forming operations are, of course, acceptable.

The two slits 31 and 51 form the lead stub 29 and the flag end 28. The lead stub 29 is shorter than the flag 34 by a width 53 of the flag. The width 53 is defined by the distance along the lateral edge 52 from the slit 51 to a top edge 54 of the inner end 26. In a flat layout of the inner end 26, the lead stub 29 fills the rectangular space which defines the flag support 32 and the flag 34.

Figure 4:
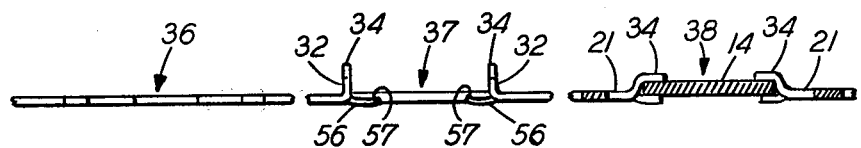
FIG. 4 is an end view of the lead frame strip of FIG. 3.

A first operation after forming the lead frames 36 in the strip 27 is the mechanical assembly of the substrate 14 to the strip. All steps in the assembly process are most conveniently done by advancing the strip to various stations at which assembly operations are performed. Spaced apertures 55 in the outer rails 41 and 42 correspond in intervals to the pitch of feed sprockets of handling equipment (not shown). The apertures 55 are used for advancing the strip 27 as well as for aligning it during various stages of the assembly of the DIP. To prepare each frame for receiving a substrate, the ends 26 in each frame undergo a forming operation, which is best explained in reference to FIGS. 3 and 4. The frame 37 shows the inner ends 26 after such a forming operation prepared to receive one of the substrates 14. The flag supports 32 have been formed up through a right angle. The flags 34 are pointing up in both rows 22.

The lead stubs 29 also have undergone a slight forming operation. At its root 56, each stub 29 has been formed downward through a small angle. The deviation of the stub 29 from the horizontal plane is then compensated for by a slight upward bend which causes a tip 57 of the lead stub to be raised upward at a slight angle from the horizontal plane of the lead frame 37. The formed up flag 34 and the lead stub 29 become oriented at substantially a right angle with respect to each other.

The flags 34 and the lead stubs 29 of the frame 37 form a nest for receiving one of the substrates 14. The substantially vertically oriented flags 34 function as guides and restraints to the longitudinal edges of the substrate 14 upon its insertion into the nest. The lead stubs 29 become a pedestal onto which the substrate 14 is placed.

The substrate 14, inserted into the nest, is then locked into place by forming the flags 34 over and against the top surface of the substrate 14 into contact with the pads 18. A clamping action by each lead in the frame 38 occurs through a resilient action by the lead stub 29. The initial slight upward bend of the lead stub 29 is straightened by bending the flag 34 over the top of and against the substrate 14. However, the straightening is only an elastic deformation, so that the flag 34 and the lead stub 29 exert a force toward each other. This force mechanically locks each corresponding lead 21 to the substrate 14.

Figure 6:
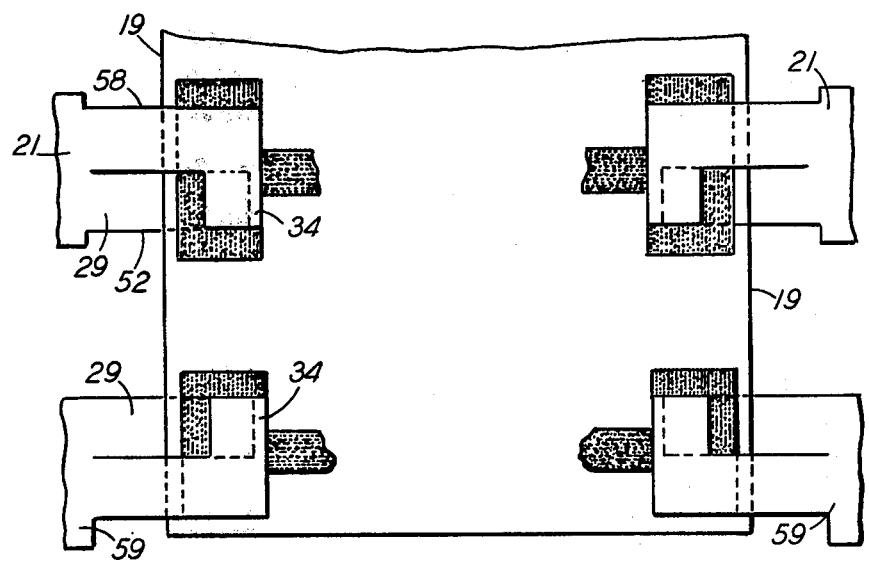
FIG. 6 is a plan view of a portion of the lead of FIG. 4 after the lead has been assembled to the substrate of the DIP.

An important feature in the mechanical assembly of the leads 21 to the substrate 14 is the relatively large size of contact area which exists between the pads 18 on both surfaces of the substrate and the respective lead 21. Significantly these contact areas remain located within the lateral edge 52 and the opposite edge 58 of the lead 21. FIG. 6 shows the vertical projection of the end portion of the lead stub 29 to correspond substantially with the area of the flag 34. The vertical superposition of the lead stub 29 and the flag 34 results in a non-torquing, grasping mechanical contact.

The superposition of the flag 34 over the lead stub 29 becomes possible through the foreshortening of the flag support 32 as it is formed over the thickness of the substrate. A complete superposition or overlap is, of course, not necessary, though it is desirable to have the lead stub 29 extend past the edge 19 of the substrate 14 by approximately the same distance as that by which the flag 34 extends past the edge 19 on the upper surface of the substrate 14.

FIG. 6 shows a portion of the substrate 14 with a lead 21 and also with a special lead 59 located at the end of the substrate 14. The lead 59 is special to the extent that an offset in the lead stub 29 and the flag end 28 with respect to the center of the lead 59 permits the last contact pads 18 to be offset from the standard spacing. The last pair of contact pads are consequently more closely spaced to the next pair than the one tenth of an inch spacing would normally require. The substrate 14, in turn, is foreshortened to permit a greater amount of molded plastic to cover the end of the substrate 14.

The amount of the offset in the lead 59 is a matter of choice. It is a compromise between a greater strength in the plastic body portion and an associated risk of shorting the lead 21 to the lead 59 during the solder operation.

It should also be noted that, when reference is made to the upper or to the lower surface of the substrate, such a reference is meaningful only in relationship to the specifically described embodiment. It must be realized that the lead 21 can be easily inverted with respect to the substrate 14. Also the external leads may ultimately by bent up or down with respect to the package, without departing from the scope of the present invention.

Of the assembly process of the DIPs in accordance with this invention, several groups of process steps can be distinguished. A first group has already been described. It relates to the forming of the lead frame 36 in the strip 27. The mechanical steps of forming the lead frames are similar to making other known lead frames. The method differs from other known methods in that the inner ends are lanced in the described manner to form the flag end 28 and the lead stub 29. The flag end 28 and the stub 29 are preferably retained in the same plane. This permits the strip 27 to be routinely re-reeled without damaging the inner ends 26 of the leads 21.

However, the forming of the lead frames 36 can be combined with the assembly of the substrate 14 into the strips. Such an integration of steps leads to the elimination of the lead frame 36 as an intermediate step in the assembly of the DIPs. The elimination of the lead frames 36 by forming the lead frames 37 in the strip 27 is, at the present time, not preferred.

Figure 7:
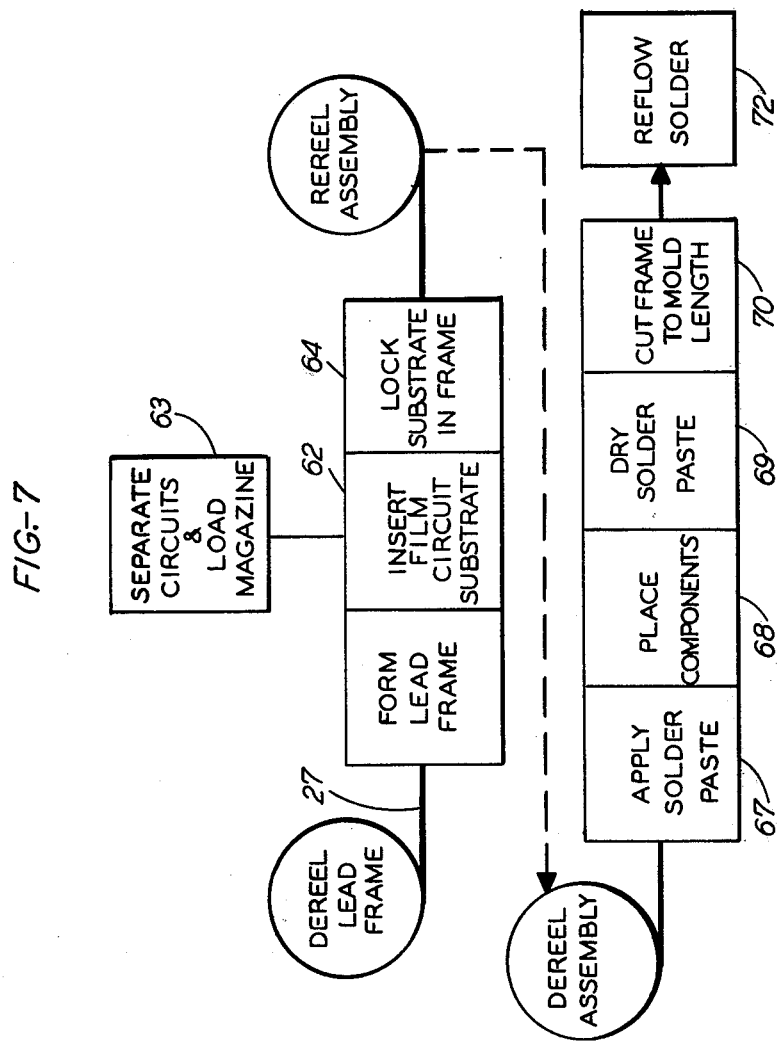
FIG. 7 is a block diagram of a preferred DIP assembly in accordance with the present invention.

FIG. 7 shows a schematic process diagram of major assembly steps following the forming of the lead frames 36 in the strip 27. The strip 27 is unreeled and fed into a lead forming position. The forming is preferably done with a forming die as an operation by itself. Of course, it is possible to perform all frame punching and forming steps in the strip 27 in a combined operation if such an integrated process is desired. In the preferred process, the lead frame 36, shown in FIG. 3, is already pre-punched in the strip and merely the nest in each frame is formed as shown by the frame 37.

The strip 27 is then advanced to align the lead frame in which the inner ends 26 have been formed into a nest with a film circuit insertion location 62. The substrates 14 are fed in sequence from a load magazine 63 to the insertion location 62. And one substrate 14 is inserted into each nest as it becomes aligned with the substrate. After the insertion of the substrate 14 into the nest of the lead frame 37, the strip 27 is again indexed to advance the frame 37 and the inserted substrate 14 to a locking location 64. At the locking location 64, a forming die (not shown) is preferably used to lock the substrates 14, one after the other, in place by bending the flag support 32 to position the flag 34 against the upper pad 18 in the manner described.

After locking each substrate 14 into its respective frame as shown by the frame 38, it is presently preferred to re-reel the product, namely, the strip 27 with assembled substrates 14. The strip 27 is safely re-reeled at this point in the process and can be stored if it is so desired. With respect to the above-described substrate assembly, it should be noted that the forming of the inner ends 26, the insertion of the substrates 14 into the formed nest, and the locking of the substrates into the strip is preferably intended to be performed simultaneously on different frames which may be, of course, adjacent to one another, as it is shown in the strip 27 of FIG. 3. More practically, however, the various locations or stations may be separated from each other. Consequently, the frames may have to advance through several index positions before they are subjected to the next following step as it has been described.

The following group of assembly steps shown in FIG. 7 pertain to the application of solder paste, and to assembling some components according to presently known techniques. The strip 27 is dereeled and fed successively through a solder application station 67, a component assembly station 68, a solder drying station 69, and a frame cutting station 70. At the solder application station, a commercially available solder paste is applied. If it is also desired to place additional components on the substrate 14 such as chip capacitors (not shown) for instance, the solder paste is not only applied to the leads 21 in the area where they clamp the substrate 14, but also to such selected sites for the components.

At the component placement station 68, components, such as chip capacitors, are placed into the areas which have been pre-coated with solder paste. The strip is then advanced to permit all assembled circuits to pass through the solder drying station 69 to the frame cutting station 70. The solder drying station uses elevated temperatures to evaporate a volatile substance from the paste to set or harden the paste. However, the temperatures at the drying station 69 are kept within a range in which the circuits or components on the substrates 14 would not be damaged should the indexing movement of the continuous strip 27 be stopped for any great length of time as, for instance, during any unforeseen downtime of the process line.

After the strip has been indexed past the drying station 69, it advances to the frame cutting station 70. It is presently contemplated to cut the strip 27 into lengths of several of the frames 38. The lengths correspond to the lengths of molds in which the body portion is formed.

A commercially available reflow solder oven heats the assembled frames 38 prior to molding in a separate operation. The solder reflow operation 72 is performed separately to prevent damage to assembled parts should the previously described assembly operation have to be stopped for any reason.

The solder reflow operation 72 permanently attaches each of the leads 21 to the substrate 14. Also, any added components, such as chip capacitors, have become permanently assembled to the circuits on the substrates 14 during the solder reflow operation. Remaining steps in the assembly operation involve cleaning the frames from oxides and solder residue and molding the body portions 12. The molding operation is then followed by conventional finishing steps such as deflashing, trimming the leads from their frames and forming the leads.

From the above description it can be seen that various changes in the preferred embodiment can be made without departing from the spirit and scope of the invention. The invention is intended to be defined only by the scope of the appended claims.

What is claimed is:

1. An electrical structure comprising:

a metal body having at least one end with first and second lateral edges and a top edge extending between the lateral edges, the end having a first slit extending from the first lateral edge of the body toward the center of the body and a second slit located substantially at a right angle to the first slit, the second slit originating at an intersection with the first slit and extending away from said end of the body, said first and second slits forming a lead stub bounded by said first lateral edge of the body and by said first and second slits, said first slit also forming a flag from the body, said flag being bounded by said first slit, by an end portion of said first lateral edge of said body, by the top edge of the end and by an end portion of the second lateral edge of the body, the flag being attached to the body by a support bounded by an extension of the second lateral edge away from the flag and by the second slit; and a substrate having two major surfaces and at least one contact pad located on each of the surfaces adjacent to an edge thereof, the lead stub being located against the contact pad on the one major surface of the substrate and the support forming a step adjacent to the edge of the substrate, the flag being offset by the height of the step with respect to the lead stub and located against the corresponding contact pad on the other major surface of the substrate.

2. An electrical lead structure according to claim 1, wherein the length of the support extends through the step and the flag has a width which is substantially as great as the height of the step.

3. An electrical lead structure according to claim 2, wherein the lead stub and the flag are solder bonded to their respective contact pads.

4. An electrical article wherein a plurality of leads extend in a row from at least one edge of a substrate, each lead having one end bonded to the substrate, the article comprising:

a plurality of bond sites located along the edge, each bond site including a pair of conductive pads in substantial superposition on opposite major surfaces of the substrate; and each of the leads being bonded to a respective one of the pairs of pads, such lead having a substantially flat lead stub located at the end of a body portion of the lead in contact with one of the pads, a support extending from the body portion laterally offset from the lead stub in a direction of the longitudinal extent of the edge and being formed around the edge of the substrate, and a flag integrally formed with the support and extending from the support in a direction of the longitudinal extent of the edge and opposite to the offset of the support from the lead stub, said flag located in contact with the other one of the pads.

5. An electrical article according to claim 4, wherein the end of the flag is in substantial superposition to the end of the lead stub.

6. A method of assembling an article wherein a plurality of leads held in a lead frame become attached to a substrate, comprising:

lancing an inner free end of each lead in the lead frame with an "L" type slit extending from a lateral edge of each lead toward its center and along its center away from the end of the lead, thereby forming a stub lead and a support adjacent the stub lead, the support terminating in a flag extending acrosss the end of the lead;

forming the support and the flag upward as a vertical guide for an edge of the substrate;

placing the substrate on top of the lead stub with the edge of the substrate substantially against the support; and forming the support to place the flag against the upper surface of the substrate.

7. An electrical lead frame structure comprising:

a plurality of leads arranged in at least one group, wherein each lead extends in parallel to the other leads, and terminates in an end, said end having first and second lateral edges and a top edge extending between the lateral edges, said end having a first slit extending from the first lateral edge of the end toward the center of the end and a second slit located substantially at a right angle to the first slit, the second slit originating at an intersection with the first slit and extending away from said top edge, said first and second slits forming a lead stub bounded by said first lateral edge of said end and by said first and second slits, said first slit also forming a flag from said end, said flag being bounded by said first slit, by an end portion of said first lateral edge of said end, by the top edge of said end and by an end portion of the second lateral edge of said end, the flag being attached to said end by a support bounded by an extension of the second lateral edge away from the flag and by the second slit;

a cross support interconnecting said ends of such group to retain the relative spacings between such ends; and a pair of parallel, spaced outer rails integrally connected to the cross support of such group.

8. An electrical lead frame structure according to claim 7, wherein said at least one group of leads comprises at least one first and one second group of leads, and wherein said outer rails locate said ends of said first group of leads spaced from and opposite to said end of said second group of leads.

* * * * *